(12) United States Patent
Englert et al.

(10) Patent No.: US 10,768,243 B2
(45) Date of Patent: Sep. 8, 2020

(54) METHOD AND DETECTION DEVICE FOR DETECTING A HIGH-IMPEDANCE GROUND FAULT IN AN ELECTRICAL ENERGY SUPPLY NETWORK WITH A GROUNDED NEUTRAL POINT

(71) Applicant: SIEMENS AKTIENGESELLSCHAFT, Munich (DE)

(72) Inventors: Heiko Englert, Burgthann (DE); Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 67 days.

(21) Appl. No.: 16/161,348

(22) Filed: Oct. 16, 2018

(65) Prior Publication Data

US 2019/0128944 A1    May 2, 2019

Related U.S. Application Data

(60) Provisional application No. 62/577,783, filed on Oct. 27, 2017.

(51) Int. Cl.
*G01R 31/02* (2006.01)
*G01R 31/08* (2020.01)
(Continued)

(52) U.S. Cl.
CPC .......... *G01R 31/50* (2020.01); *G01R 31/086* (2013.01); *H02H 3/17* (2013.01); *H02H 1/0007* (2013.01); *H02H 3/16* (2013.01)

(58) Field of Classification Search
CPC ...... G01R 31/50; G01R 31/08; G01R 31/085; H02H 3/17; H02H 3/16; H02H 1/0007
See application file for complete search history.

(56) References Cited

U.S. PATENT DOCUMENTS

2009/0204347 A1* 8/2009 Nowicki ................ G01R 31/50
                                                                   702/58
2012/0310430 A1* 12/2012 Black ................... H02H 1/0061
                                                                   700/293
(Continued)

FOREIGN PATENT DOCUMENTS

CN    105445511 A  *  3/2016
CN    104880647 B     5/2018
(Continued)

*Primary Examiner* — Christopher P McAndrew
*Assistant Examiner* — Zannatul Ferdous
(74) *Attorney, Agent, or Firm* — Laurence Greenberg; Werner Stemer; Ralph Locher

(57) ABSTRACT

A method detects a high-impedance ground fault in an electrical energy supply network with a grounded neutral point. A test signal is fed via a detection device into the energy supply network, the test signal has a frequency which differs from the network frequency of the energy supply network. To enable a reliable detection, with low equipment costs, of high-impedance ground faults in energy supply networks with a grounded neutral point, a three-phase test signal is fed into the phase conductors of the energy supply network as the test signal. A measuring signal which indicates the residual voltage of the test signal is generated with the detection device. The residual voltage is compared with a threshold value using a test device of the detection device, and the presence of a high-impedance ground fault is detected if the residual voltage exceeds the threshold value.

9 Claims, 3 Drawing Sheets

(51) Int. Cl.
    *G01R 31/50*     (2020.01)
    *H02H 3/17*     (2006.01)
    *H02H 1/00*     (2006.01)
    *H02H 3/16*     (2006.01)

(56) References Cited

U.S. PATENT DOCUMENTS

| | | | | |
|---|---|---|---|---|
| 2014/0015510 | A1* | 1/2014 | Bengtsson | H01F 27/42 |
| | | | | 323/356 |
| 2015/0204731 | A1* | 7/2015 | Corcos | G01K 7/015 |
| | | | | 374/178 |
| 2015/0247891 | A1 | 9/2015 | Maun et al. | |
| 2015/0355262 | A1* | 12/2015 | Hu | G01R 31/50 |
| | | | | 324/509 |
| 2016/0072270 | A1* | 3/2016 | Rostron | H02H 3/081 |
| | | | | 700/294 |
| 2016/0276820 | A1* | 9/2016 | Olivas | H02H 1/003 |
| 2017/0052222 | A1* | 2/2017 | Pasdar | G01R 31/11 |
| 2018/0088167 | A1 | 3/2018 | Kussyk et al. | |
| 2018/0328976 | A1* | 11/2018 | Mitchem | G01R 31/085 |

FOREIGN PATENT DOCUMENTS

| | | |
|---|---|---|
| DE | 10307972 A1 | 9/2004 |
| EP | 2808688 A1 | 12/2014 |
| EP | 2880729 A1 | 6/2015 |
| EP | 3300201 A1 | 3/2018 |
| WO | 2004003578 A1 | 1/2004 |
| WO | 2014040620 A1 | 3/2014 |

* cited by examiner

METHOD AND DETECTION DEVICE FOR DETECTING A HIGH-IMPEDANCE GROUND FAULT IN AN ELECTRICAL ENERGY SUPPLY NETWORK WITH A GROUNDED NEUTRAL POINT

CROSS-REFERENCE TO RELATED APPLICATION

This application claims the priority, under 35 U.S.C. § 119(e), of provisional application No. 62/577,783 filed Oct. 27, 2017; the prior application is herewith incorporated by reference in its entirety.

BACKGROUND OF THE INVENTION

Field of the Invention

The invention relates to a method for detecting a high-impedance ground fault in an electrical energy supply network with a grounded neutral point, in which a test signal is fed with a detection device into the energy supply network. The test signal has a frequency which differs from the network frequency of the energy supply network, and the presence of a high-impedance ground fault is inferred on the basis of a measuring signal produced by the test signal.

In the event of a break in a stranded conductor of an energy transmission line of an energy supply network, and in the event of a subsequent fall of a line end onto the ground, very high-impedance faults can occur, particularly in the presence of high ground resistance. High-impedance ground resistances occur, for example, if the stranded conductor makes contact with asphalt, rock or dry sand. Particularly in medium-voltage networks with a solidly grounded neutral point, high-impedance faults represent a major problem, since these faults are difficult to detect and the high contact voltage which may still be present following the occurrence of the fault can endanger people. In North America, Saudi Arabia and in parts of Africa where medium-voltage networks with a solidly grounded neutral point are commonplace, primarily in the form of overhead lines, numerous accidents occur annually with fatal consequences due to high-impedance faults of this type.

The detection of the high-impedance faults is hindered, in particular, by the following factors:
a) The levels of the fault currents are difficult to distinguish from the operating currents/load currents when no faults are present.
b) During operation, asymmetric loads occur in these networks as a result of normal operating conditions, since loads have a single-phase connection to these networks. The operating currents cannot therefore be distinguished from asymmetries caused by high-impedance faults.

Passive methods which detect currents and/or voltages at one or more locations in the network are used primarily for the detection of high-impedance ground faults in medium-voltage networks with a solidly grounded neutral point. Most methods extract characteristic features of high-impedance faults (e.g. characteristics of transient processes in the (re-)ignition and extinction of the high-impedance ground fault. Various pattern recognition methods, evaluation of synchrophasors or further passive methods are used here. From previous experience, however, these methods are not suitable under all circumstances for a reliable detection of high-impedance ground faults. Under certain circumstances, it may therefore arise, with passive methods of this type, that faults are either not detected or the methods have a tendency to over-function. Harmonics, for example, which are caused by the operation of inverters under normal operating conditions, may erroneously result in a detection of ground faults which are not actually present.

A comparatively reliable method, in which a plurality of indicators of the presence of a high-impedance ground fault are interlinked, is known, for example, from published, European patent application EP 2880729 A1, corresponding to U.S. patent publication No. 2015/0247891.

A method is furthermore known from published, European patent application EP 3300201 A1 (corresponding to U.S. patent publication No. 2018/0088167) in which signals are actively fed into the line to be monitored by means of powerline modems of the type used to transmit data and information via lines of an energy supply network, and the frequency-dependent attenuation of the modem signals is evaluated. This method is potentially capable of detecting high-impedance faults. In extensive networks, however, a large number of powerline modems is required (in each case two for each line to be monitored and a further modem on an adjacent line), thereby incurring relatively high equipment costs.

SUMMARY OF THE INVENTION

The object of the invention is to indicate a method and a device for monitoring an energy transmission device, with which a reliable detection of high-impedance ground faults is enabled with low equipment costs in energy supply networks with a grounded neutral point.

This object is achieved according to the invention by a method with the features of the independent method patent claim. Advantageous designs of the method according to the invention are indicated in sub claims.

It is thus provided according to the invention that a three-phase test signal is fed into the phase conductors of the energy supply network as a test signal. A measuring signal which indicates the residual voltage of the test signal is generated with the detection device. The residual voltage is compared with a threshold value using a testing device of the detection device, and the presence of a high-impedance ground fault is detected if the residual voltage exceeds the threshold value.

In the method according to the invention, a high-impedance ground fault can be reliably detected with low equipment costs, since only one detection device, which can be connected at any location in the energy supply network, is required to detect the fault. A high-impedance ground fault can be detected with high reliability through the evaluation of the residual voltage of the three-phase test signal.

According to one advantageous embodiment of the method according to the invention, it is provided that the three-phase test signal is formed in that a symmetrical three-phase network with an isolated neutral point is simulated with the detection device.

In this way, the method for detecting high-impedance ground faults in isolated networks can be linked particularly advantageously with the detection of such faults in grounded networks. The evaluation takes place, as it were, in relation to the three-phase symmetrical and isolated energy supply network formed by the detection device, the network being connected to the grounded network for the fault detection.

According to a further advantageous embodiment of the method according to the invention, it is provided that the frequency of the test signal is selected within a range in which transformers present in the energy supply network have a high impedance.

A further advantageous embodiment of the method according to the invention provides that the test signal is fed into the energy supply network by means of a coupling device, wherein the coupling device is configured as a capacitive coupling, as an analog amplifier or as an inverter.

Furthermore, it can advantageously be provided that the residual voltage of the test signal is determined with the detection device in relation to the ground potential of the energy supply network.

In order to be able to carry out a reliable evaluation of the measuring signal, it can be provided that the testing device performs a separation of the measuring signal from signals having the network frequency of the energy supply network.

For this purpose, the testing device can advantageously contain a band filter which is set to the frequency of the injected test signal. Alternatively, the testing device can contain a correlator which performs a comparison between the measuring signal and the test signal in order to separate the residual voltage of the test signal from components of a residual voltage caused by asymmetries of the energy supply network and having network frequency signal components and to evaluate only the residual voltage of the injected test signal.

A further advantageous embodiment furthermore provides that either an absolute amplitude of the residual voltage or a deviation of the residual voltage from a stationary value of the residual voltage is compared with the threshold value.

It can furthermore be provided that a test signal in the form of a sinusoidal wave, a pulsed signal or pseudo-random binary signal (PRBS) is used.

The object is furthermore achieved by a detection device for detecting a high-impedance ground fault in an electrical energy supply network with a grounded neutral point.

It is provided here that the detection device is configured for connection to the phase conductors of the electrical energy supply network and for the injection of a test signal into the energy supply network. The test signal has a frequency which differs from the network frequency of the energy supply network. The detection device is configured to infer the presence of a high-impedance ground fault on the basis of a measuring signal produced by the test signal. It is provided according to the invention that the detection device is configured to inject a three-phase test signal into the phase conductors of the energy supply network as a test signal and to generate a measuring signal which indicates the residual voltage of the test signal. The detection device has a testing device which is configured to compare the residual voltage with a threshold value. The testing device is configured to detect the presence of a high-impedance ground fault if the residual voltage exceeds the threshold value.

With regard to the detection device according to the invention, all details described above and below for the method according to the invention and vice versa apply accordingly, in particular the detection device according to the invention is configured to carry out the method according to the invention in any given embodiment or a combination of any given embodiments. In respect of the advantages of the detection device according to the invention, reference is also made to the advantages described in relation to the method according to the invention.

The invention is explained in detail below with reference to an example embodiment. The specific design of the example embodiment is not to be understood as limiting in any way for the general design of the method according to the invention and the detection device according to the invention; instead, individual design features of the example embodiment can be freely combined in any manner with one another and with the features described above.

Other features which are considered as characteristic for the invention are set forth in the appended claims.

Although the invention is illustrated and described herein as embodied in a method and a detection device for detecting a high-impedance ground fault in an electrical energy supply network with a grounded neutral point, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
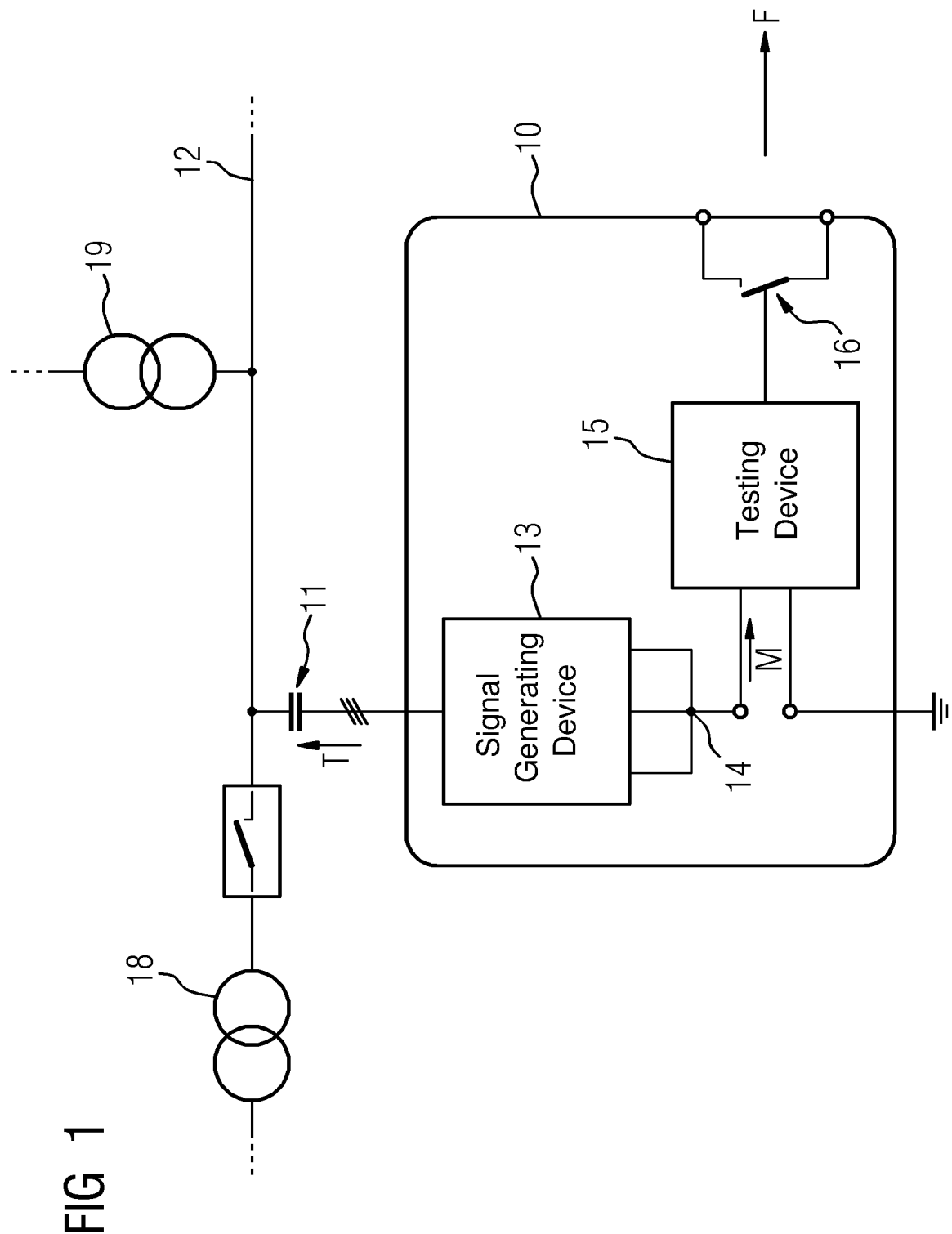
FIG. 1 is a schematic representation of a detection device for detecting high-impedance ground faults.

Referring now to the figures of the drawings in detail and first, particularly to FIG. 1 thereof, there is shown a detection device 10 for detecting high-impedance ground faults in an energy supply network with a grounded neutral point. The detection device 10 is connected to the phase conductors of an energy supply network 12 via a three-phase coupling device 11 which is configured as a capacitive coupling in the example shown in FIG. 1. The energy supply network 12 and the coupling device 11 are shown in a single-phase representation in FIG. 1 simply for the sake of greater clarity. The detection device 10 can be connected at any location in the energy supply network 12.

The detection device 10 has a signal-generating device 13 which is configured to inject a three-phase test signal T having a frequency which differs from the network frequency of the energy supply network via the coupling device 11 into the phase conductors of the energy supply network 12. A symmetrical three-phase network with a neutral point 14 isolated from the ground potential of the energy supply network 12 to be monitored is simulated in the signal-generating device 13 which may, for example, be a three-phase inverter. The frequency of the test signal should preferably lie within a range in which transformers present in the energy supply network 12, e.g. input transformers 18 or output transformers 19, have the highest possible impedance. The symmetrical isolated network of the signal-generating device 13 is thus, as it were, coupled via the coupling device 11 to the grounded and, where appropriate, asymmetrically loaded, energy supply network 12.

The detection device 10 furthermore has a testing device 15 with which a measuring signal M in the form of a residual voltage of the test signal T in relation to the ground potential of the energy supply network 12 is checked. For this purpose, the testing device 15 can advantageously contain a band filter which is set to the frequency of the injected test signal. Alternatively, the testing device can contain a correlator which performs a comparison between the measuring signal and the test signal in order to separate the residual voltage of the test signal from components of a residual voltage caused by asymmetries of the energy supply network and having network frequency signal components and to evaluate only the residual voltage of the injected test signal T.

For the check, the residual voltage is compared with a threshold value in the testing device 15. It can be provided here that either an absolute amplitude of the residual voltage or a deviation of the residual voltage from a stationary value of the residual voltage is compared with the threshold value. If the residual voltage exceeds the threshold value, the testing device infers the presence of a high-impedance ground fault in the energy supply network 12 and emits a fault signal F indicating the ground fault, e.g. by closing an output relay 16. The fault signal F can be used, for example, to control a power switch 17 and therefore disconnect the energy supply network 12 from a power feed and thus shut down the fault.

One particular advantage of the described detector device 10 is that high-impedance ground faults can be detected in the entire network with a single device, and therefore with very low equipment costs.

The mode of operation in detecting a high-impedance ground fault will be explained in detail with reference to the representation shown in FIG. 2.

Figure 2:
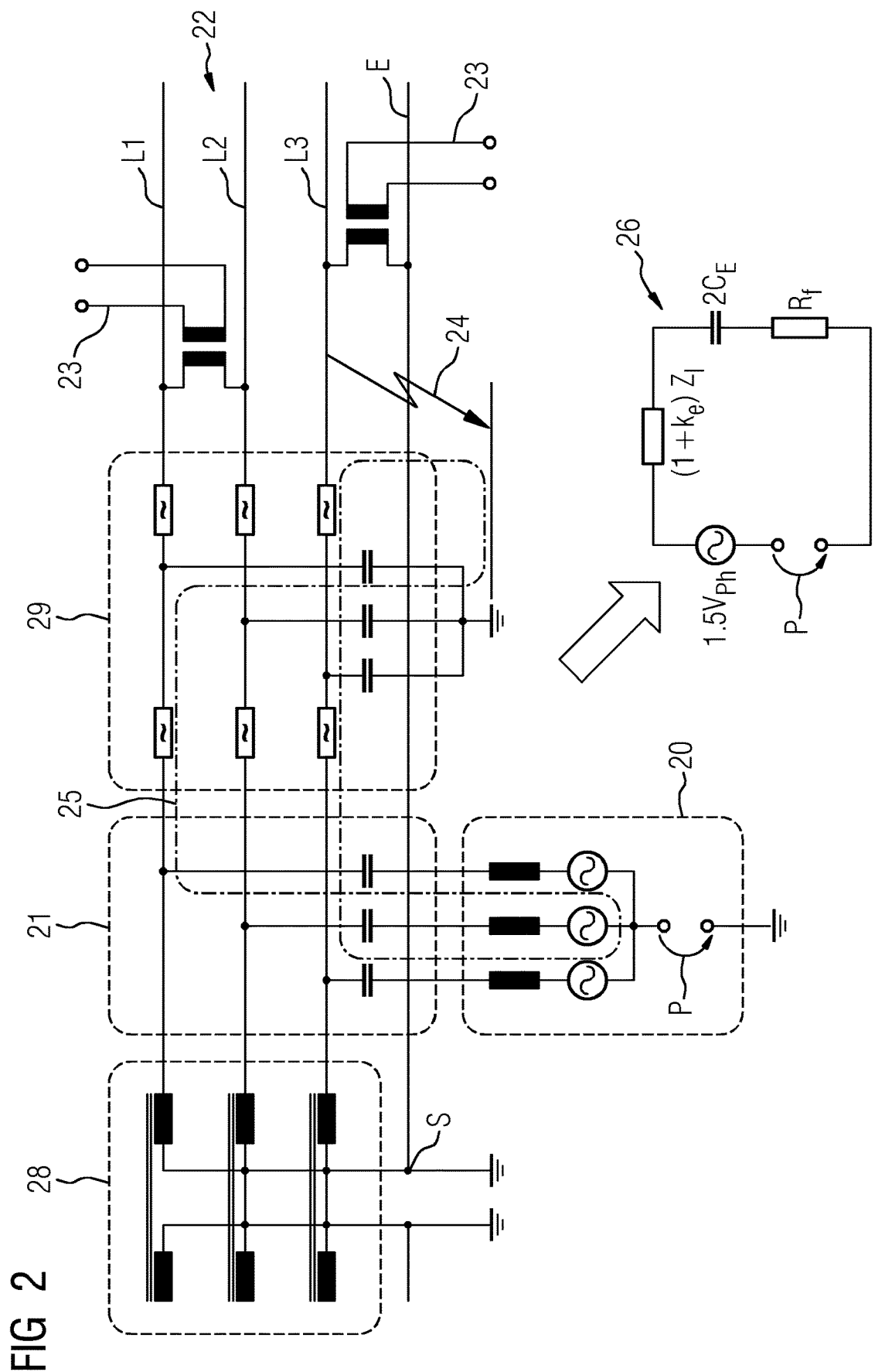
FIG. 2 is a schematic representation of the detection device connected to an energy supply network to explain the detection of high-impedance ground faults.

FIG. 2 shows a schematic representation of the detection device 10, shown by reference numeral 20 in FIG. 2. The detection device 20 is coupled via a coupling device 21 to a three-phase energy supply network 22 which has three phase conductors L1, L2 and L3. The energy supply network 22 is connected via its neutral point S to an input transformer 28 with a solid electrical connection to ground E. A three-phase line section 29 is highlighted within the energy supply network 22 by way of example. Electric loads 23 which are intended to symbolize an asymmetrical electric load of the energy supply network 22 are furthermore indicated by way of example in FIG. 2.

The detection device 20 and the energy supply network 22 are designed in principle according to the representation shown in FIG. 1, so that the descriptions given in relation to FIG. 1 can be transferred accordingly to FIG. 2.

In the example shown in FIG. 2, it is assumed that a high-impedance ground fault, which is indicated by a lightning bolt 24, has developed between the phase conductor L3 and ground E. The ground fault produces the mesh, drawn in FIG. 2 by means of a broken line, in which a current flow is driven by the test signal T in the form of an impressed test voltage. This mesh is closed in the energy supply network 22, on the one hand via the ground fault present between the affected phase conductor L3 and ground and, on the other hand, via the capacitive coupling between the individual phase conductors and ground (in the example of the mesh 25, the capacitive coupling between the phase conductor L1 and ground). A second mesh (not shown in FIG. 2) is closed via the phase L3 affected by the ground fault and the further phase (here L2) unaffected by the ground fault.

The superposition of these two meshes can be summarized in a simplified equivalent circuit diagram 26. A residual voltage which can be used to detect the ground fault occurs at the locations indicated by a curved arrow P (in the detection device 20 and in the simplified equivalent circuit diagram 26) only in the case where a ground fault is present.

Figure 3:
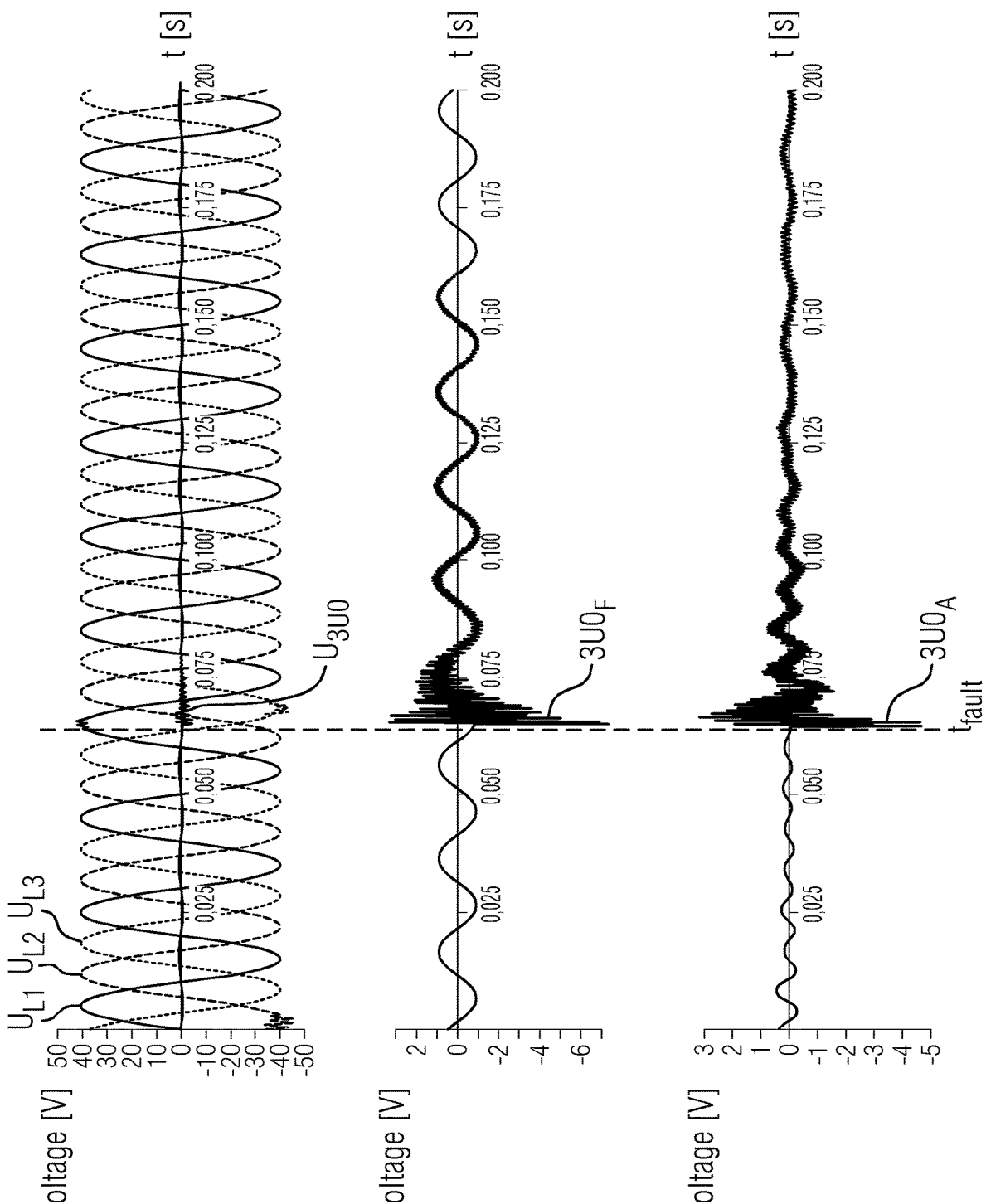
FIG. 3 are graphs showing examples of characteristics of phase voltages and residual voltages during a high-impedance fault in the energy supply network.

FIG. 3 shows the result of a simulation of the conditions in the event of a ground fault in a heavily asymmetrically loaded energy supply network 22.

The signal 3U0F shown in the middle diagram in FIG. 3 shows the residual voltage at the location of the high-impedance ground fault before the occurrence (t<tfault) of and during the ground fault (tfault<t). An asymmetry resulting from asymmetric loading of the network is clearly evident here. This asymmetry prevents a detection of the ground fault with signals at the network frequency.

30 kHz has been selected for the frequency of the superposed test signal. Since the frequency of the test signal is significantly higher than the network frequency (normally 50 or 60 Hz), the presence of the measuring signal in the form of the residual voltage of the test signal can be recognized in the diagram only as a broader line of the signal shown. Following the occurrence of the ground fault (t>tfault at 60 ms), the presence of the residual voltage of the test signal is clearly evident at the fault location (middle diagram) and at the injection point of the test signal (3U0A in the lower diagram). The test signal is superposed with transient phenomena and signals at the network frequency which necessitate a filtering out of the measuring signal from the present signal mixture by means of bandpass filter or correlation with the injected test signal (e.g. correlation with the alpha/beta component of the test signal transformed with the Clarke transformation). A distinction can then be made by means of a simple threshold value comparison between a fault-free condition and an existing ground fault.

To summarize, a three-phase test signal is injected here via a coupling device into an effectively grounded network with a detection device (cf. FIGS. 1 and 2) for detecting high-impedance ground faults. This test signal can be generated either by means of an inverter or via a D/A converter with a connected amplifier.

According to the invention, a measuring signal in the form of the residual voltage of the injected test signal is formed and used as a criterion for detecting a high-impedance ground fault. As a result, as it were, a superposition of an isolated injection at a frequency differing from the network frequency onto an effectively grounded network is carried out in order to then perform the detection of the ground fault in the isolated network of the test signal. A method for detecting ground faults in isolated networks at a frequency differing from the network frequency is thus used to detect a high-impedance ground fault at the network frequency in an effectively grounded network. A detection of high-impedance ground faults in isolated networks has proven to be reliable in central Europe, where such networks are prevalent.

Although the invention has been illustrated and described in detail above by means of preferred example embodiments, the invention is not limited by the disclosed examples and other variations may be derived herefrom by the person skilled in the art without departing the protective scope of the patent claims set out below.

The invention claimed is:

1. A method for detecting a high-impedance fault having a presence of a fault current in a three-phase electrical energy supply network with a grounded neutral point, which comprises the steps of:

feeding a test signal, via a detection device, into the three-phase electrical energy supply network, the test signal having a frequency differing from a network frequency of the three-phase electrical energy supply network, the test signal being a three-phase test signal injected into phase conductors of the three-phase electrical energy supply network;

generating a measuring signal indicating a residual voltage, the residual voltage is vector sum of the voltages to ground of the several phrase wires of an electrical supply circuit, of the test signal induced in three-phases of the three-phase electrical energy supply network via the detection device;

comparing the residual voltage with a threshold value using a testing device of the detection device; and detecting a presence of the high-impedance fault if the residual voltage exceeds the threshold value.

2. The method according to claim 1, which further comprises forming the three-phase test signal such that a symmetrical three-phase network with an isolated neutral point is simulated with a signal-generating device of the detection device.

3. The method according to claim 1, which further comprises selecting the frequency of the test signal within a range in which transformers present in the three-phase electrical energy supply network have a high impedance.

4. The method according to claim 1, which further comprises injecting the test signal by means of a coupling device into the three-phase electrical energy supply network, the coupling device is configured as a capacitive coupling, as an analog amplifier or as an inverter.

5. The method according to claim 1, which further comprises determining the residual voltage of the test signal with the detection device in relation to a ground potential of the three-phase electrical energy supply network.

6. The method according to claim 1, which further comprises performing, via the testing device, a separation of the measuring signal from signals having the network frequency of the three-phase electrical energy supply network.

7. The method according to claim 1, which further comprises comparing either an absolute amplitude of the residual voltage or a deviation of the residual voltage from a stationary value of the residual voltage with the threshold value.

8. The method according to claim 1, which further comprises forming the test signal in a form of a sinusoidal wave, a pulsed signal or a pseudo-random binary signal.

9. A detection device assembly for detecting a high-impedance fault having a presence of a fault current in a three-phase electrical energy supply network with a grounded neutral point, the detection device assembly comprising:

a detection device configured to:
  connect to phase conductors of the three-phase electrical energy supply network;
  inject a test signal into the three-phase electrical energy supply network, the test signal having a frequency which differs from a network frequency of the three-phase electrical energy supply network, said detection device configured to inject the test signal as a three-phrase test signal into phase conductors of the three-phase electrical energy supply network; and
  generate a measuring signal which indicates a residual voltage, the residual voltage is vector sum of the voltages to ground of the several phrase wires of an electrical supply circuit, of the test signal induced in three-phases of the three-phase electrical energy supply network;

said detection device having a testing device configured to compare the residual voltage with a threshold value; and said testing device is configured to detect a presence of a high-impedance ground fault if the residual voltage exceeds the threshold value.

* * * * *